United States Patent
Keysar et al.

(10) Patent No.: US 8,957,488 B2
(45) Date of Patent: Feb. 17, 2015

(54) SELF POWERING APPLICATION SPECIFIC INTEGRATED CIRCUIT

(75) Inventors: Shani Keysar, Haifa (IL); Ofer Navon, Pardes Hanna (IL)

(73) Assignee: Sol Chip Ltd., Haifa (IL)

( * ) Notice: Subject to any disclaimer, the term of this patent is extended or adjusted under 35 U.S.C. 154(b) by 227 days.

(21) Appl. No.: 13/053,610

(22) Filed: Mar. 22, 2011

(65) Prior Publication Data

US 2011/0169554 A1 Jul. 14, 2011

Related U.S. Application Data

(63) Continuation of application No. PCT/IL2009/000930, filed on Sep. 29, 2009.

(60) Provisional application No. 61/100,770, filed on Sep. 29, 2008.

(51) Int. Cl.
   *H01L 27/14* (2006.01)
   *H01L 25/16* (2006.01)
   *H01L 31/0392* (2006.01)

(52) U.S. Cl.
   CPC ........ *H01L 25/167* (2013.01); *H01L 31/03921* (2013.01); *Y02E 10/50* (2013.01)
   USPC .......................................... 257/431; 257/446

(58) Field of Classification Search
   CPC ........... H01L 2924/00014; H01L 2224/48091; H01L 2224/13147; H01L 2924/00; H01L 27/142; H01L 31/042; H01L 31/02021; H01L 31/0522; H01L 31/0232; H01L 31/048; H01L 31/0521; H01L 31/058; H01L 31/0524

USPC ............ 136/244; 438/48; 257/414, 431, 499, 257/446

See application file for complete search history.

(56) References Cited

U.S. PATENT DOCUMENTS

| | | | |
|---|---|---|---|
| 5,155,565 A | | 10/1992 | Wenz et al. |
| 5,998,808 A | * | 12/1999 | Matsushita ...................... 257/74 |
| 6,313,396 B1 | * | 11/2001 | Glenn ............................ 136/244 |
| 6,680,468 B1 | | 1/2004 | Wang |
| 2002/0170591 A1 | | 11/2002 | Armer et al. |
| 2004/0185667 A1 | * | 9/2004 | Jenson ........................... 438/689 |
| 2005/0145274 A1 | * | 7/2005 | Polce et al. ................... 136/244 |

FOREIGN PATENT DOCUMENTS

| | | | |
|---|---|---|---|
| JP | 09312349 | * | 2/1997 |
| JP | 9312349 | | 12/1997 |
| WO | 03079438 | | 9/2003 |

OTHER PUBLICATIONS

International Search Report for the corresponding International Patent Application PCT/IL2009/000930; Date of Mailing Mar. 26, 2010.

* cited by examiner

*Primary Examiner* — Duy T Nguyen

(74) *Attorney, Agent, or Firm* — M&B IP Analysts, LLC

(57) ABSTRACT

A system and method for fabricating a self-powering integrated circuit chip having an integrated circuit, which may be a MEMS or CMOS device or the like and a thin film photovoltaic cell stack overlayed thereupon or on the opposite side of the substrate on which the IC is manufactured upon.

10 Claims, 3 Drawing Sheets

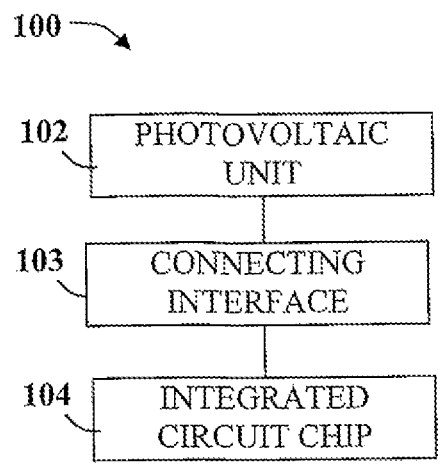
PRIOR ART
Fig. 1
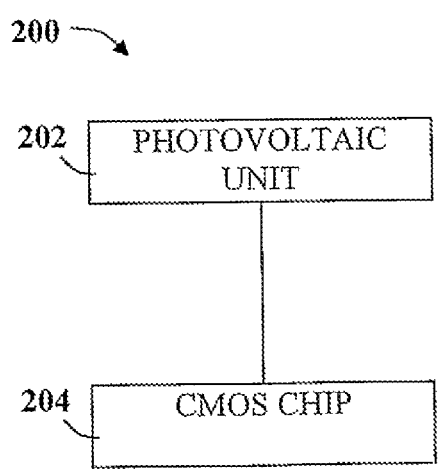 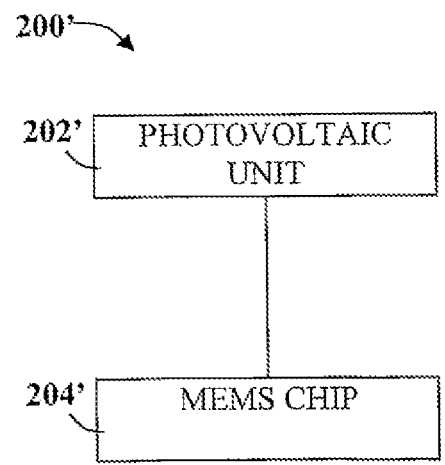
Fig. 2a  Fig. 2b

US 8,957,488 B2

SELF POWERING APPLICATION SPECIFIC INTEGRATED CIRCUIT

CROSS-REFERENCE TO RELATED APPLICATIONS

The present application is a continuation of International Patent Application No. PCT/IL2009/000930, filed Sep. 29, 2009. The International Application claims the benefit of U.S. Provisional Patent Application No. 61/100,770, filed Sep. 29, 2008, both of which are incorporated herein by reference for all that they contain.

FIELD OF THE INVENTION

The present invention relates to integrated circuit chips. More particularly, the present invention relates to application-specific integrated circuits (ASICs) that derive power from solar energy.

BACKGROUND

Application-Specific Integrated Circuits (ASICs), including Very Large Scale Integration (VLSI) chips typically draw power from external sources such as grid power (mains), batteries or the like. Increasingly, however, devices utilizing such components demand greater levels of energy efficiency. This is largely due to the prevalence of wireless and mobile devices with convenience items becoming more widespread.

Personal communication devices, such as mobile phones, PDAs, handheld PCs and the like, as well as many entertainment devices, such as media players, MP3, MP4, mobile DVD, digital cameras and the like, as well as other household, office and leisure gadgets are commonly powered by batteries of electrochemical power cells. A drawback with battery operated devices is that electrochemical power cells often run out of power at inconvenient times and therefore batteries need to be regularly recharged or replaced.

Such devices may be less dependent upon power provided by electrochemical power cells if some of their components were able to power themselves. Thus, the energy efficiency of mobile devices may be improved by a convenient and effective solar powered VLSI chip. Furthermore, such solar powered components could be effectively used in applications where a power supply is unavailable. Self-powering components may therefore be utilized in a variety of stand-alone communication units, road signs for remote locations, in buoys, floats or other maritime applications.

Although attempts have been made to connect VLSI chips to photovoltaic cells (PVs) in order that they might draw solar power therefrom, the chips and photovoltaic cells are generally manufactured separately and later connected together using external wiring, gates, contacts or terminals. For example, U.S. Pat. No. 6,680,468 to Wang, titled, "Electrical-supply-free MOS integrated circuit", describes an electrical-supply-free MOS integrated circuit comprising: a semiconductor device having a current terminal, an input voltage terminal, and a common terminal. The voltage difference between the input voltage terminal and the common terminal controls current flow through the current terminal. An optoelectronic device is also provided to convert incident light into an electrical signal. In another example, PCT Application Publication No. WO 03079438 to Gidon, et al. titled, "Multijunction Photovoltaic Device with Shadow-free Independent Cells and the Production Method Thereof", describes a multijunction photovoltaic device with independent cells. Contact pick-ups are provided on the front and/or rear face of the cells by means of metal wells, the sides of which are insulated from the semi-conducting layers.

Furthermore, United States Patent Application No. 20020170591 to Armer, et al., titled "Method and apparatus for powering circuitry with on-chip solar cells within a common substrate", describes a light-powered transponder. In order to create sufficient voltage differential, two photovoltaic elements are used. The photovoltaic elements generate voltages of different polarities. Despite the inherent difficulties presented by the use of a standard Complementary metal-oxide-semiconductor (CMOS) process, Aimer's system is directed towards achieving a voltage differential sufficient to power an ASIC by using photovoltaic elements independently to generate voltages with different polarities.

As mentioned, all the above-described solutions require separate interconnecting conductors between their integrated circuits and their power sources. Any additional components however compromise the dimensions of the host devices and may provide additional sources of failure. The need remains, therefore, for efficient solar power provision to integrated circuits. Embodiments described herein below address this need.

SUMMARY OF THE INVENTION

Certain embodiments disclosed herein include a self-powering application specific integrated circuit (ASIC). The ASIC comprises an integrated circuit (IC); and at least one power cell comprising at least one photovoltaic (PV) cell, the at least one power cell is manufactured on at least one of: over the IC and on a substrate side opposite to the IC.

Certain embodiments disclosed herein include a manufacturing method for producing a self-powering application specific integrated circuit (ASIC). The method includes manufacturing an integrated circuit (IC) on a substrate; depositing a passivation layer at least partially coating the IC; and manufacturing at least one photovoltaic (PV) cell over at least one of: the passivation layer and on the substrate on a side opposite to the IC.

BRIEF DESCRIPTION OF THE FIGURES

For a better understanding of the invention and to show how it may be carried into effect, reference will now be made, purely by way of example, to the accompanying drawings. With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 1 is a schematic block diagram representing a solar powered integrated circuit of the prior art;

FIGS. 2a and 2b are schematic block diagrams representing two solar-powered ASIC units according embodiments of the integrated solar powered device;

DESCRIPTION OF SELECTED EMBODIMENTS

Figure 3:
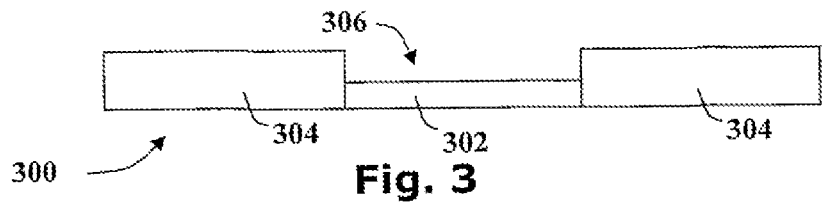
FIGS. 3 to 7 are schematic cross-sections showing the stages of fabrication of an exemplary embodiment of the solar powered ASIC.

Embodiments of the present invention relate to a combined integrated circuit and power cell comprising at least one photovoltaic cell. Other embodiments teach a method for manufacturing the combined integrated circuit device combining two manufacturing processes. The process of manufacturing the integrated circuit may be any Microelectromechanical Systems (MEMS)/CMOS including STD CMOS processes.

The device in accordance with the present invention can be used as an autonomous device, as a source of energy to other devices or as a stand-alone charger.

Reference is now made to FIG. 1 which is a schematic block diagram representing a solar powered integrated circuit 100 of the prior art. It is noted that, in order to use solar energy, devices of the prior art include three separate components: an integrated circuit 104; a photovoltaic cell 102; and a connecting interface 103.

The integrated circuit 104 may be a miniaturized electronic circuit typically including semiconductor devices as well as passive components. Integrated circuits are generally manufactured upon the surface of a thin substrate of semiconductor material. Variously, integrated circuits 104 may be based upon Complementary metal-oxide-semiconductor (CMOS) chips, Microelectromechanical Systems (MEMS) chip, a Very Large Scale Integration (VLSI), or the like.

The photovoltaic cell 102 is configured to convert light into electricity typically using the photovoltaic effect. Because, in prior art systems the photovoltaic cell 102 is generally manufactured separately from the integrated circuit, it is necessary to provide the connecting interface 103.

The connecting interface 103 provides a conductive pathway, such as external wiring, gates, contacts, terminals, and the like, between the photovoltaic cell 102 and the integrated circuit 104. In addition, the connecting interface may further provide an intermediate external source layer of a power supply, such as an electrochemical cell, a capacitor or such like.

Referring now to FIGS. 2a and 2b, schematic block diagrams represent two novel embodiments of solar-powered application specific integrated circuit (ASIC) units, as disclosed herein. With particular reference to FIG. 2a, one embodiment of the solar powered ASIC 200 may include a photovoltaic cell 202 and a CMOS-type chip 204. In FIG. 2b, another embodiment of the solar powered ASIC 200' is shown including the photovoltaic cell 202' and a MEMS-type chip 204'. It will be noted that in contradistinction to the prior art, embodiments of the solar powered ASIC disclosed herein do not require connecting interfaces 103 (FIG. 1). It will be appreciated that reducing the number of separate components is important in technologies, such as integrated circuits, where space saving is an important factor.

Self-powering ASIC units such as embodiments of the solar powered ASICs 200, 200' may be enabled by fabricating an integrated unit upon p-type wafers, for example. P-type wafers are commonly used as substrate materials for both photovoltaic cells and semiconductor devices. Thus, a common p-type wafer substrate may be shared by the photovoltaic cell 202, 202' and the chip 204, 204', thereby reducing the total space requirements.

According to some embodiments, a photovoltaic cell layer may be fabricated over a VLSI device, or alternatively a photovoltaic cell may be fabricated onto one side of the substrate with the VLSI fabricated upon the reverse side. Various photovoltaic fabrication techniques may be used, including thin-film manufacturing and the like. Thus, the photovoltaic cell 202, 202' and chip circuit 204, 204' may be manufactured in one process or as one piece with no additional connecting interface. Hence, the solar-powered ASIC may be manufactured in one process, according to electrical and other rules for integration of the layers.

Possible methods for the fabrication of embodiments for the self-powering ASIC unit are described below with reference to FIGS. 3 to 8. FIGS. 3 to 7 show schematic cross sections representing the main elements of the ASIC unit during various stages of its preparation. FIG. 8 is a flowchart showing the steps of a general method of manufacture.

FIG. 3 is a schematic cross section showing the main elements of an integrated circuit base wafer 300. The base wafer 300 may be prepared, for example, using a standard CMOS process. In particular, the integrated circuit base wafer 300 includes metal pads 302 and a passivation layer 304.

The passivation layer 304 partially covers the metal pads 302; however, the passivation layer 304 is interrupted by openings 306 which provide channels through which an electrical connection may be formed between the metal pads 302 and overlying layers, such as electrical layers, of the ASIC or other components.

Figure 4:
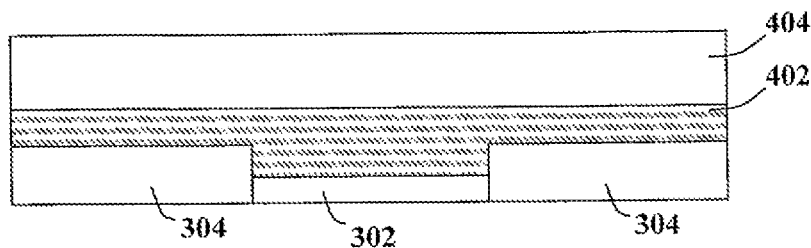

FIG. 4 is a schematic cross section showing the base wafer 300 of FIG. 3 over which photovoltaic enabling layers have been deposited. Two photovoltaic enabling layers are represented by a lower photovoltaic metal electrode layer 402 and a photovoltaic stack 404.

Various materials, well known in the art, may be used as photovoltaic stacks 404 of embodiments of the solar powered ASIC. For example, thin film photovoltaic stacks may use hydrogenated amorphous silicon (a-Si.H) for a PIN (P type, Intrinsic layer, N type) photocell, microcrystalline silicon (μ-Si:H) photo cells, Cadmium telluride (CdTe) that use a NIP structure which is a variation of the PIN structure, Copper indium gallium selenide (GIGS) or the like.

The lower photovoltaic metal electrode layer 402 provides conductive communication between the photovoltaic stack 404 and the metal pads 302 exposed by the openings 303 in the passivation layer 304. Typically, the lower photovoltaic metal electrode layer 402 is a metal deposition layer such as aluminum for example, although any conducting layer may be used to suit requirements.

Figure 5:
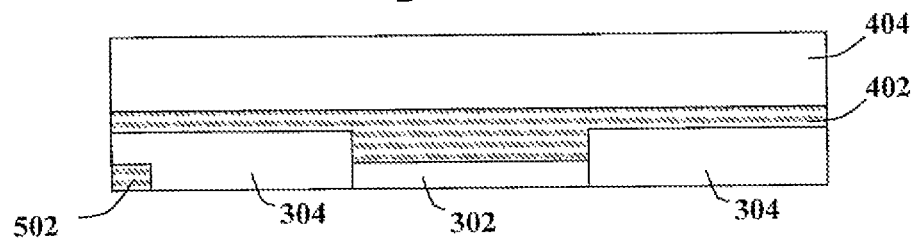

In FIG. 5, the cross section of the wafer of FIG. 4 is shown with an additional opening 502 exposing the metal pad 302 of the base wafer 300. The opening 502 may be used to provide a conductive channel connecting the metal pad 302 to the upper electrode 702 (FIG. 7) of the photovoltaic cell 404. Typically, the opening 502 may be created using an [ash] etching process in which the photovoltaic stack 404 is etched to re-expose the metal pads 302 and possibly to expose new pads for connecting to the photovoltaic cell.

Figure 6:
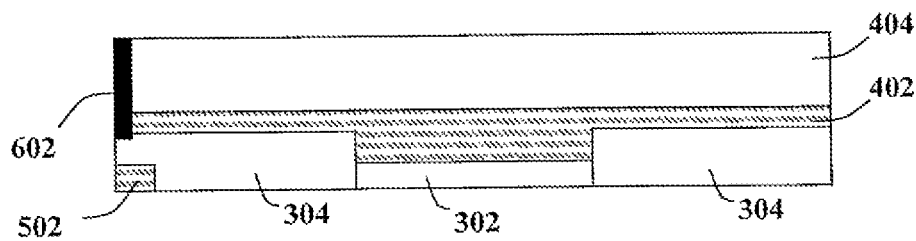

Reference is now made to FIG. 6 which shows a cross sectional view of the wafer of FIG. 5 including a separator 602. The separator 602 provides a film isolating the top electrode 702 (FIG. 7) and bottom electrodes 402 of the photovoltaic stack 404. The spacer 602 may be formed by deposition of an isolating film such as silicon dioxide (SiO2), over the wafer, which may then be selectively etched back to re-expose. Typically, following the etching back process, spacers are located along the walls of the photovoltaic cell 404.

Figure 7:
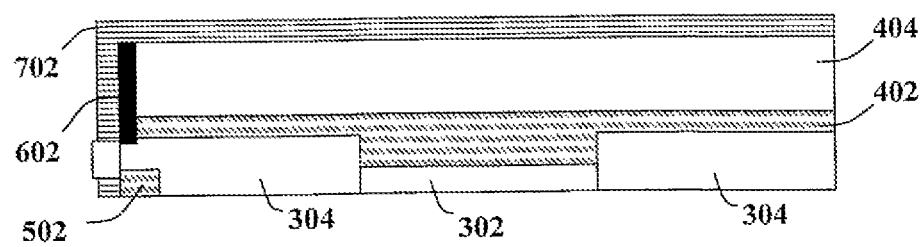
Figure 8:
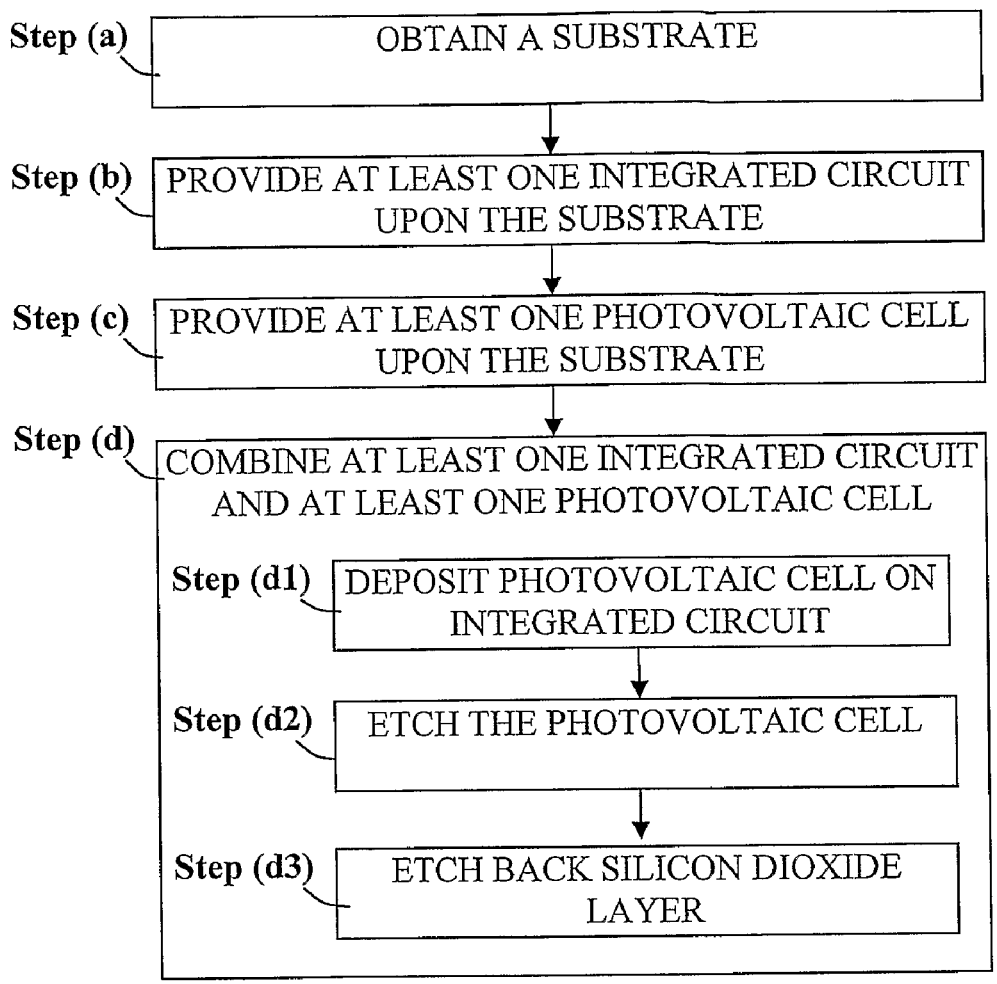
FIG. 8 is a flow chart illustrating a method for producing a self-powering ASIC unit in accordance with an embodiment.

Reference is now made to FIG. 7 showing a schematic cross section of the main elements of an embodiment of the solar powered ASIC following fabrication. A top electrode 702 has been provided for the photovoltaic stack 404. The top electrode may be provided for example by depositing an aluminum layer over the photovoltaic stack 404 and in conductive communication with the base wafer via the opening 502 created during the etch process.

It is noted that the lower electrode 402 and the top electrode 702 may be prepared by the CMOS process that is used for the VLSI part of the integrated device, and therefore may vary from one process to the other.

It will be appreciated that although the embodiment described above in relation to FIGS. 3 to 7 relates to an integrated circuit having an overlaid photovoltaic cell. In alternative embodiments, the integrated circuit and photovoltaic layers may be deposited upon reverse sides of a single substrate. Still other configurations will occur to one of ordinary skill.

Reference is now made to FIG. 8 which shows a flowchart representing a method for producing a self-powering ASIC unit in accordance with an embodiment. The production method comprises the following steps:

step (a) obtaining a substrate;
step (b)—providing at least one integrated circuit upon the substrate;
step (c)—providing at least one photovoltaic cell upon the substrate, and
step (d)—combining the at least one integrated circuit and at least one photovoltaic cell.

In step (a) a substrate is obtained. Integrated circuits may be manufactured in the surface of a thin substrate, optionally made of semiconductor material.

In step (b) at least one integrated circuit may be provided upon the substrate. The integrated circuits may be CMOS, MEMS, or other circuits.

In step (c) at least one photovoltaic cell may be provided upon the substrate. A layer that comprises at least one photovoltaic cell may be added to the integrated circuit in order to produce the integrated ASIC.

In step (d) the integrated circuit and the photovoltaic cell may be combined. In order to combine the integrated circuit and the photovoltaic cell into an integrated ASIC, the following sub steps may be followed: step (d1)—depositing the at least one photovoltaic cell on the integrated circuit; step (d2)—etching the at least one photovoltaic cell; and step (d3)—etching back a silicon dioxide layer.

In step (d1) the photovoltaic cell is deposited. On top of the integrated circuit, a Photovoltaic Metal Electrode (BPVE) layer is deposited and on top of BPVE layer a thin film photovoltaic stack is placed. In step (d2) the photovoltaic cell etched. Strong acid or mordant is used to cut into the unprotected parts of a metal surface to create a design in the metal. The etching step creates openings that re-expose parts of the integrated circuit and open new pads that will later be connected to a top electrode of the photovoltaic cell.

In step (d3) a silicon dioxide layer is being etched back. A silicon dioxide layer is deposited over the ASIC unit and then etched back, providing an isolating film between the top and bottom photovoltaic electrodes.

The scope of the present invention is defined by the appended claims and includes both combinations and sub combinations of the various features described hereinabove as well as variations and modifications thereof, which would occur to persons skilled in the art upon reading the foregoing description. In the claims, the word "comprise", and variations thereof such as "comprises", "comprising" and the like indicate that the components listed are included, but not generally to the exclusion of other components.

What is claimed is:

1. A self-powering application-specific integrated circuit (ASIC), comprising:
    an integrated circuit (IC) having at least one integrated electrical circuit and a passivation layer at least partially coating the IC and at least a metal pad covered at least in part by the passivation layer, wherein the passivation layer includes openings allowing electrical connection between the at least metal pad and a first electrical layer of the IC, wherein the IC is fabricated on a semiconductor substrate; and
    at least one power cell comprising at least one deposited photovoltaic (PV) cell, the at least one power cell overlaying the passivation layer of the IC, wherein an upper electrode of the at least one power cell connects to the at least metal pad via an opening formed in a bottom surface of the passivation layer, and wherein the IC and the at least one power cell form a monolithic device such that the at least one power cell is structured to self-power the at least one electric circuit.

2. The self-powering ASIC of claim 1, wherein the IC is any one of: an application specific integrated circuit, a metal oxide semiconductor, a very large scale integration (VLSI) chip, a microelectromechanical system (MEMS), and a complementary metal oxide semiconductor (CMOS) chip.

3. The self-powering ASIC of claim 1, wherein the semiconductor substrate comprises a p-type wafer substrate.

4. The self-powering ASIC of claim 1, wherein the at least one PV cell comprises a thin film PV stack.

5. The self-powering ASIC of claim 4, wherein the thin film PV stack is any one of: a PIN (p-type semiconductor, intrinsic semiconductor, n-type semiconductor) photo cell, and a NIP (n-type semiconductor, intrinsic semiconductor, p-type semiconductor) photo cell.

6. The self-powering ASIC of claim 1, wherein the at least metal pad is Integrally connected to the at least one power cell.

7. The self-powering ASIC of claim 1, wherein the at least one power cell further comprises at least one PV metal electrode.

8. The self-powering ASIC of claim 7, wherein the at least one PV metal electrode connects the at least one power cell to an electrical layer through a passivation opening of at least one of: the IC and the ASIC.

9. The self-powering ASIC of claim 7, further comprising at least one isolating film layer.

10. The self-powering ASIC of claim 9, wherein the isolating film layer is a silicon dioxide layer.

* * * * *